United States Patent
Park et al.

[19]

[11] Patent Number: 6,160,746
[45] Date of Patent: Dec. 12, 2000

[54] SEMICONDUCTOR MEMORY WITH AUTO-TRACKING BIT LINE PRECHARGE SCHEME

[75] Inventors: Hee-Choul Park, Sungnam-shi; Su-Chul Kim, Seoul, both of Rep. of Korea

[73] Assignee: Samsung Electronics, Co., Ltd., Suwon, Rep. of Korea

[21] Appl. No.: 09/253,288

[22] Filed: Feb. 19, 1999

[30] Foreign Application Priority Data

Aug. 4, 1998 [KR] Rep. of Korea ............... 98-31951

[51] Int. Cl.[7] ............................................. G11C 7/00
[52] U.S. Cl. ............... 365/203; 365/230.03; 365/230.06; 365/204
[58] Field of Search .................... 365/203, 204, 365/230.01, 230.03, 230.06

[56] References Cited

U.S. PATENT DOCUMENTS

| | | | |
|---|---|---|---|
| 5,574,688 | 11/1996 | Mclure et al. | 365/200 |
| 5,590,086 | 12/1996 | Park et al. | 365/230.03 |
| 5,629,900 | 5/1997 | Hirose et al. | 365/230.03 |
| 5,631,871 | 5/1997 | Park et al. | 365/203 |
| 5,646,900 | 7/1997 | Tsukude et al. | 365/205 |
| 5,835,956 | 11/1998 | Park et al. | 711/167 |
| 5,848,011 | 12/1998 | Muraska et al. | 365/207 |
| 5,933,373 | 8/1999 | Takahashi | 365/189.06 |
| 5,946,251 | 8/1999 | Sato et al. | 365/203 |
| 5,946,264 | 8/1999 | Mclure | 365/230.06 |

*Primary Examiner*—Viet Q. Nguyen
*Attorney, Agent, or Firm*—Marger Johnson & McCollom, P.C.

[57] ABSTRACT

Disclosed herein is a semiconductor memory device which comprises a decoding block, an OR gate and first and second precharge circuits. The decoding block generates section word line select signals and column select signals in response to a block select signal and row and column pre-decoder signals. And, the OR gate mixes the section word line select signals to generate a precharge signal. This forces the first precharge circuit to be activated or inactivated in synchronization with the section word line select signals. Furthermore, the second precharge circuit is activated or inactivated in synchronization with the column select signals. According to the precharge scheme of the present invention, there is prevented the period of the inactivation (activation) of the top and bottom precharge signals from being overlapped with the period of the activation (inactivation) of the section word line. As a result, the semiconductor memory device has an improved access speed.

6 Claims, 5 Drawing Sheets

SEMICONDUCTOR MEMORY WITH AUTO-TRACKING BIT LINE PRECHARGE SCHEME

FIELD OF THE INVENTION

The present invention relates to a semiconductor memory device and, more particularly to memory device having an auto-tracking bit line precharge scheme.

BACKGROUND OF THE INVENTION

Recently, as semiconductor memory devices are integrated highly, the number of memory cells are increased which are connected on a bit line. This becomes a cause of increasing the bit line loading (or capacitance). As the bit line loading becomes greater, the speed to read/write data from/into a memory cell (hereinafter, referred to as "an access speed") becomes delayed.

One approach to solve such a problem is to precharge bit lines at a predetermined voltage level before reading/writing data from/to the cell. It is general to precharge the bit lines by use of the pulse signal like an address detection (ATD) signal or a clock signal. It is to reduce current consumption and to prevent the drop of the access speed. A simplified diagram of a conventional semiconductor memory device, particularly, SRAM, with a bit line precharge scheme is illustrated in FIG. 1.

The SRAM device 1 comprises a pair of bit lines BL and BLB between which a memory cell MC for storing data information is connected. At top sides of bit lines BL and BLB, PMOS transistors M1 and M2 for bit line precharge are connected which are turned on/off by means of a top side precharge signal PTOP from an AND gate G1. The AND gate G1 receives a bank select signal BS and a first precharge control signal PPRECH1 and generates the top side precharge signal PTOP. Similarly, at bottom sides of bit lines BL and BLB, PMOS transistors M9, M10 and M11 for bit line precharge are connected therebetween which are turned on/off by means of a bottom side precharge signal PBOP from an AND gate G2. The AND gate G2 receives the bank select signal BS and a second precharge control signal PPRECH2 and generates the bottom side precharge signal PTOP.

As illustrated in the drawing, a section word line SWL connected to the memory cell MC is selected and driven by both an AND gate G3 (used as a driver) and a decoding block 10. The decoding block 10 generates section word line select signals BSLi and column select signals Yi and YiB (i=0–n) in response to the bank select signal BSi, row pre-decoder signals XPDOi and column pre-decoder signals YPDOi. The AND gate G3 has two input terminals connected to a main word line MWL and one of the signals BSLi, respectively. NMOS transistors M12 and M15 which are connected between the bit lines BL and BLB and a write driver 12 are turned on/off in accordance with the column select signal Yi. And, NMOS transistors M13 and M14 which are connected between the bit lines BL and BLB and a sense amplifier 14 are turned on/off in accordance with the column select signal YiB complementary to the signal Yi.

An operation of the semiconductor memory device 1 will be explained below with reference to FIG. 2, which is a timing diagram for describing a bit line precharge operation. Before the activation of the section word line, a bit line precharge operation is performed as follows.

Since the block select signal BSn and the top and bottom precharge control signals PPRECH1 and PPRECH2 are low, the AND gates G1 and G2 makes the top and bottom precharge signals PTOPn and PBOPn low. This enables the PMOS transistors M1, M2, and M9 to M11 to be turned on, and then the bit lines BL and BLB are precharged.

As shown in FIG. 2, the signals MWLn, BSn, XPDOn, YPDOn, PPRECH1 and PPRECH2 transition from low to high. First, the top and bottom precharge signals PTOPn and PBOPn go high through the AND gates G1 and G2, and the PMOS transistors M1, M2, and M9 to M11 are turned off. And then, the decoding block 10 responds to the signals BSn, XPDOn and YPDOn, which makes one of the selection word line select signals BSLi high, so that the section word line SWLn is activated through the AND gate G3. Furthermore, the decoding block 10 activates the column select signal Yn high and the column select signal YnB low, so that the bit lines BL and BLB are connected to the write driver 12 and the sense amplifier 14. After this, reading/writing may be performed according to the manner well known in the art.

When the signals BSn, PPRECH1 and PPRECH2 transition from high back to low, the top and bottom precharge signals PTOPn and PBOPn become low again. This enables the PMOS transistors M1, M2, and M9 to M11 to be turned on, so that the bit lines BL and BLB are precharged for the next reading/writing operation. And, the decoding block 10 inactivates the column select signal Yn low and the column select signal YnB high, so that the bit lines BL and BLB are separated from the write driver 12 and the sense amplifier 14.

It would be ideal if the period of the inactivation (activation) of the top and bottom precharge signals corresponds to the period of the activation (inactivation) of the section word line. That is, when the bit lines are precharged the section word line is inactivated, and when the section word line is activated the bit lines don't become precharged, which would be accomplished if the bit lines had a high impedance.

As illustrated by time interval $t_{over}$ in FIG. 2, however, since the period of the inactivation (activation) of the top and bottom precharge signals overlaps with the period of the activation (inactivation) of the section word line (for example, owing to voltage/temperature variation, and to different signal transfer path), the bit line precharge time may become long. This is because the top and bottom precharge signals PTOP and PBOT don't track the selection word line and the column select signal. As a result, the bit line precharge speed is delayed, causing the drop of the access speed.

SUMMARY OF THE INVENTION

It is therefore an object of the present invention to provide a semiconductor memory device with auto-tracking bit line precharge scheme for improving a bit line precharge speed and an access speed.

In the present invention, an array of memory device is divided into plural blocks. Each block has a plurality of memory cells each storing data and arranged at intersections of plural section word lines and plural bit line pairs. A first precharge circuit is coupled to a top side of the bit line pairs and precharges the bit line pairs in response to a precharge signal from an OR gate. The OR gate outputs the precharge signal by mixing the section word line select signals so that the precharge signal is synchronized with the section word line select signals. In the device, a column selector is further provided which selects one bit line pair in response to the column select signals, and a second precharge circuit coupled at a bottom side of the bit line pairs precharges the bit line pairs in synchronization with the column select signals.

In accordance with the precharge scheme of the present invention, the precharge signal auto-tracks the activation (inactivation) of a section word line select signal, so that the period of the inactivation (activation) of the precharge signal exactly corresponds to that of the activation (inactivation) of the section word line select signal (no overlapped period exists). Therefore, there is improved the read/write access speed of the semiconductor memory device.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

The preferred embodiment of the present invention will be described below with reference to the accompanying drawings.

Figure 3:
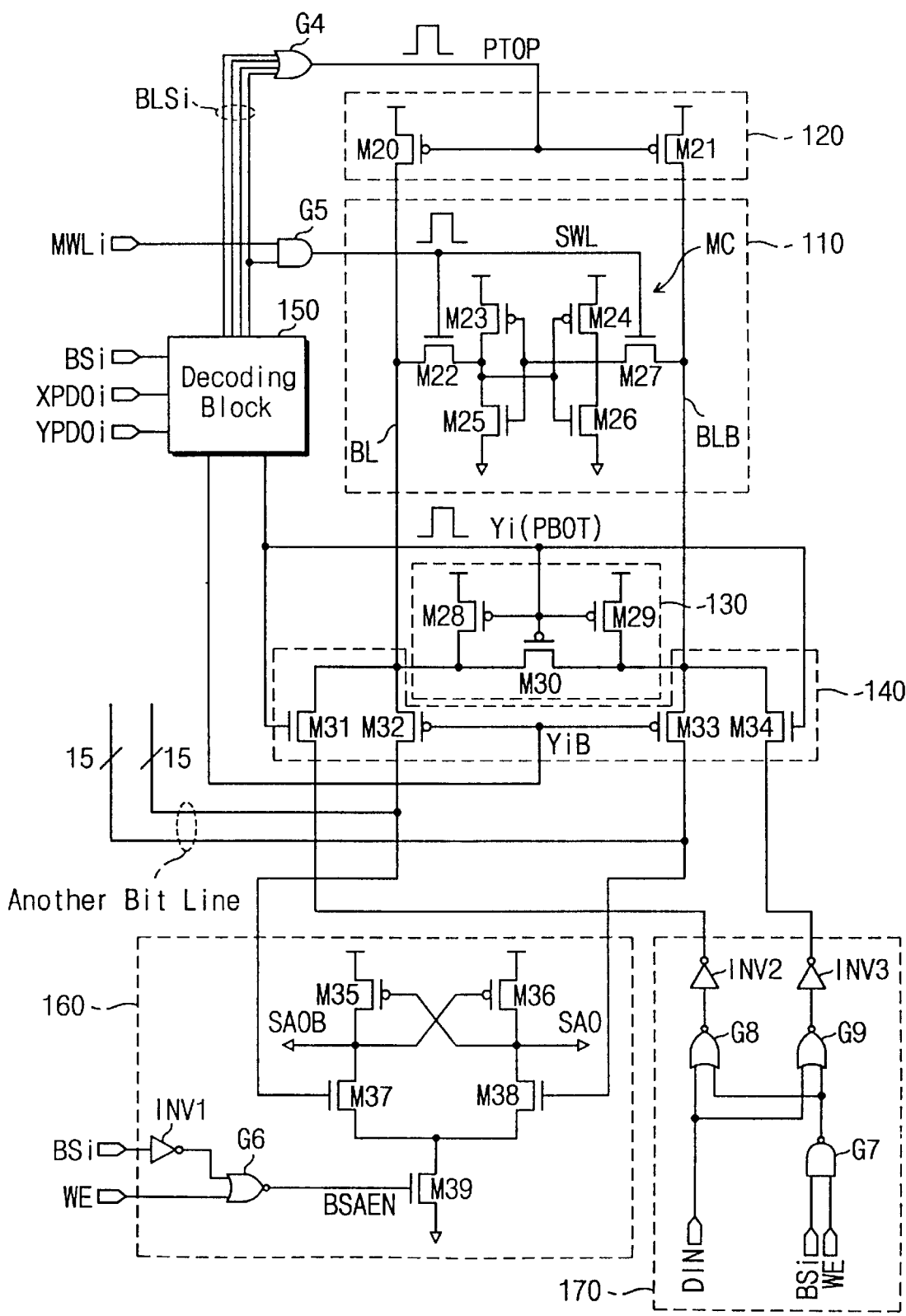
FIG. 3 is a diagram showing a bit line precharge scheme of a semiconductor memory device according to the present invention.

Referring to FIG. 3, there is illustrated a diagram showing a bit line precharge scheme according to the preferred embodiment of the present invention. The memory device 100 is a static random access memory (SRAM) device. In the device 100, an array 110 has a pair of bit lines BL and BLB, a section word line SWL and a memory cell MC which is arranged in an intersection of the section word line SWL and the bit lines BL and BLB as shown in the figure. Although one memory cell MC is illustrated in the array 110, more memory cells may be arranged according to the same manner as shown in FIG. 3. Also, in the SRAM device 100, there may be provided X- and Y-pre decoders, block select signal generator, clock generator, data input and output buffer, address buffer, etc. And, the array 110 is divided into plural blocks (not shown) of memory cells. In FIG. 3, one of memory cells in one block and associated circuits with the one memory cell are illustrated.

The SRAM device 100 comprises a first precharge circuit 120 and a second precharge circuit 130. The first precharge circuit 120 is connected to top sides of the bit lines BL and BLB and is comprised of two PMOS transistors M20 and M21. Drain electrodes of two PMOS transistors M20 and M21 are connected to the bit lines BL and BLB, respectively, and source electrodes thereof are connected to a power supply, respectively. The PMOS transistors M20 and M21 are simultaneously turned on/off according to a precharge signal PTOP (or a top side precharge signal). When the signal PTOP is activated low, the circuit 120 precharges the bit lines BL and BLB. And, the circuit 120 is inactivated when the signal PTOP transitions from low to high.

As illustrated in FIG. 3, the second precharge circuit 130 is connected between the bit lines BL and BLB (at a bottom side) and is comprised of three PMOS transistors M28, M29 and M30. The PMOS transistor M28 whose gate is connected to a column select signal Yi from a decoding block 150 has its current path formed between the bit line BL and the power supply. A gate of the PMOS transistor M29 receives the column select signal Yi, and a current path thereof is formed between the bit line BLB and the power supply. The PMOS transistors M28 and M29 act as a precharger, respectively. The PMOS transistor M30 whose gate is connected to the column select signal Yi has its current path formed between the bit lines BL and BLB. The PMOS transistor M30 acts as an equalizer. When the column select signal Yi is high (when a section word line SWL is selected), the second precharge circuit 130 is disabled. When the signal Yi is low (when the line SWL doesn't be selected), the second precharge circuit 130 is activated and precharges the bit lines BL and BLB.

In this embodiment, the column select signal Yi is used as a precharge signal (or a bottom side precharge signal PBOP) for the second precharge circuit 130, so that the activation and inactivation of the precharge circuit 130 tracks the inactivation and activation of the column select signal Yi.

Continuing to refer to FIG. 3, the SRAM device 100 further comprises a decoding block 150, an AND gate G5 used as a driver and an OR gate G4 used as a precharge signal generator. The decoding block 150 generates section word line select signals BLSi (i=0–n) and column select signals Yi and YiB in response to a block select signal BSi and row and column pre-decoder signals XPDOi and YPDOi respectively. The AND gate G5 selects and drives the section word line SWL in response to a section word line select signal BLSi and a main word line select signal MWLi. And, the OR gate G4 receives the section word line select signals BLSi to generate the precharge signal PTOP. For example, when all of the signals BLSi are low (when no section word line SWL is selected), the precharge signal PTOP from the OR gate G4 is made low, forcing the first precharge circuit 120 to precharge the bit lines BL and BLB. Contrary, when one of the signals BLSi becomes high (when the section word line SWL is selected), the precharge signal PTOP from the OR gate G4 is made high, so that the first precharge circuit 120 is inactivated.

Figure 4:
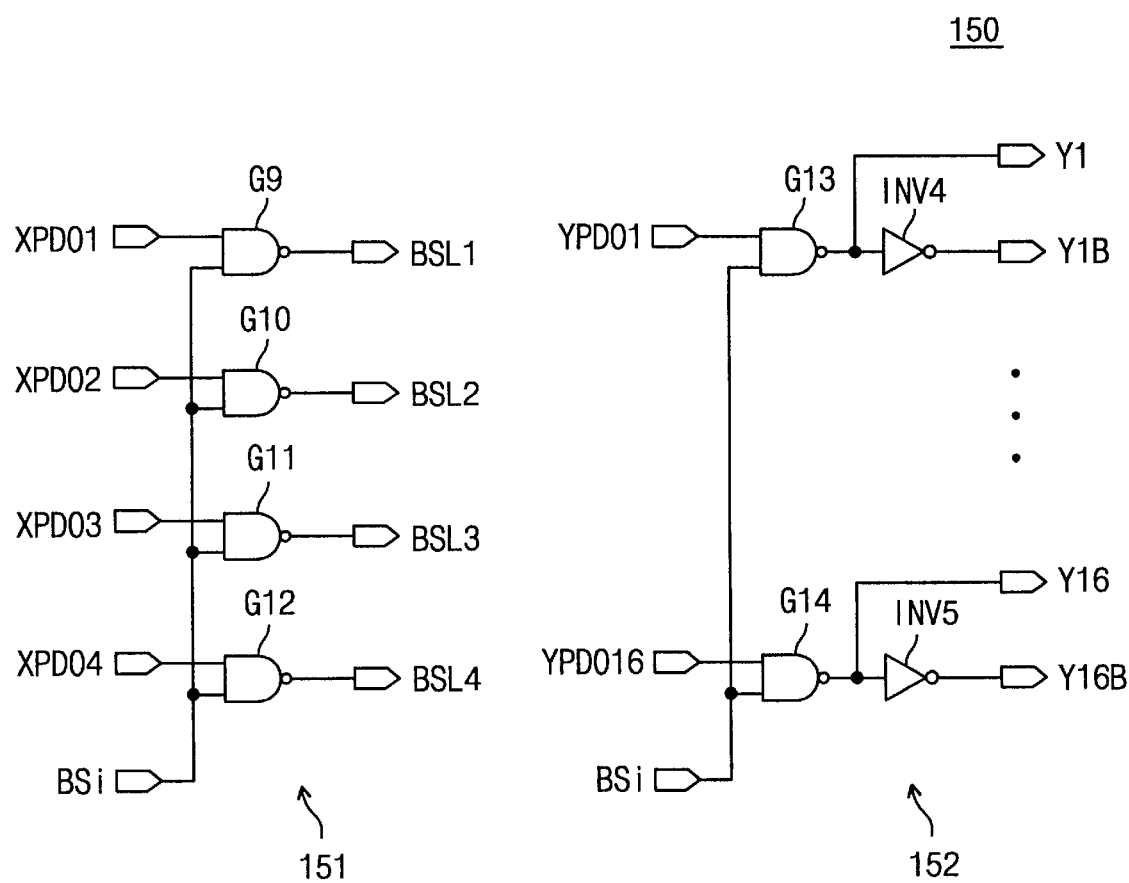
FIG. 4 is a circuit diagram of a decoding block of FIG. 3 according to a preferred embodiment of the present invention.

Referring to FIG. 4 which is a circuit diagram of the decoding block 150 according to the embodiment of the present invention, the decoding block 150 comprises row and column decoders 151 and 152. Assuming that four section word lines and 16 pairs of bit lines are provided in the array 110.

Under this condition, the row decoder 151 receives first to fourth row pre-decoder signals XPDO1 to XPDO4 and the block select signal BSi to generate first to fourth section word line select signals BSL1 to BSL4. The row decoder 151 is comprised of four NAND gates G9 to G12 connected as shown in the figure. The second logic circuit 152 receives column pre-decoder signals YPDO1 to YPDO16 and the block select signal BSi to generate column select signals Y1 to Y16 and Y1B to Y16B. The column decoder 152 is comprised of 16 NAND gates G13 to G14 and 16 inverters INV4 to INV5 connected as shown in the figure.

Referring to FIG. 3 again, the SRAM device 100 further comprises a column selector 140 (hereinafter, referred to as "Y-selector") connected to the bit lines BL and BLB. The Y-selector 140 responds to column select signals Yi and YiB from the decoding block 150 to connect the bit lines BL and BLB to a sense amplifier circuit 160 and a write driver circuit 170. That is, the Y-selector 140 selects a bit line pair of plural bit line pairs (not shown) to connect the selected bit line pair to the sense amplifier circuit 160.

As known in the description, the first and second precharge circuits 120 and 130 operate in synchronization with the section word line select signal and the column select signal. Therefore, the precharge signals PTOP and PBOT auto-track the activation (inactivation) of the section word line and the Y-selector, respectively.

Figure 1:
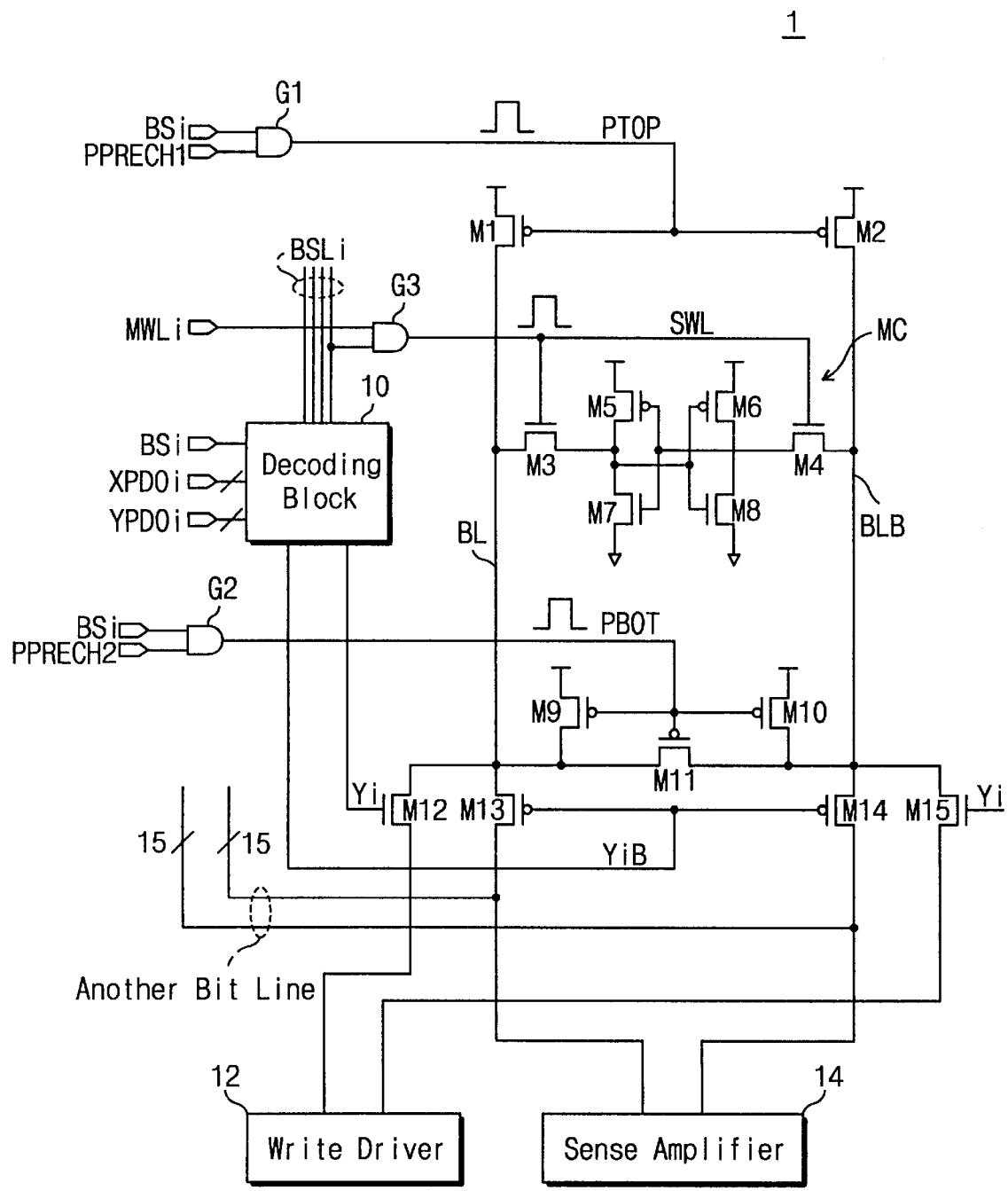
FIG. 1 is a diagram showing a bit line precharge scheme of a conventional semiconductor memory device.
Figure 2:
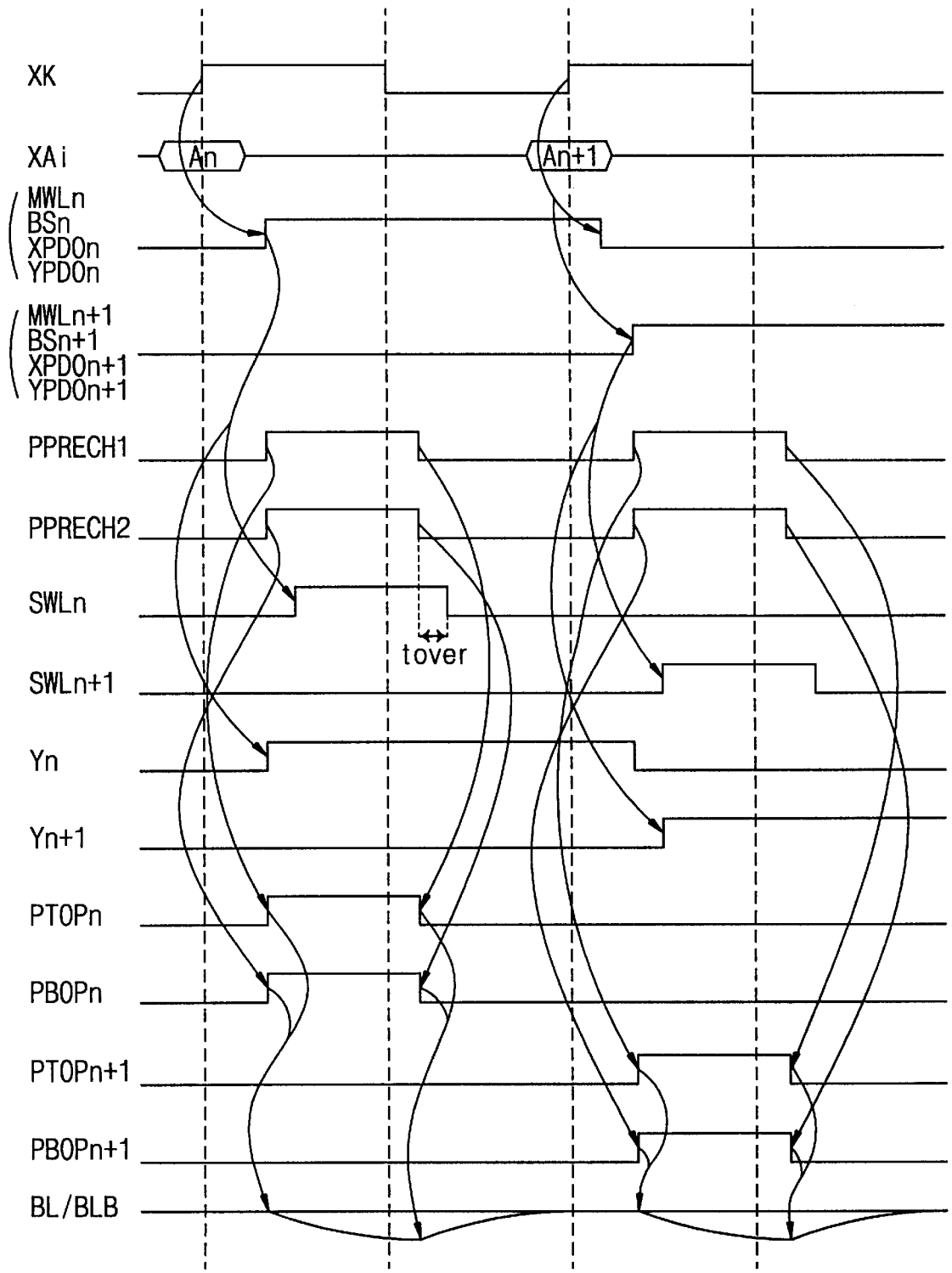
FIG. 2 is a timing diagram for describing a bit line precharge operation according to the conventional art.

An operation of the SRAM device 100 according to the present invention will be described below with reference to FIG. 5, which is a timing diagram for explaining a bit line precharge operation. As known in FIG. 5, the signals BSn, XPDOn and YPDOn have a pulse form instead of such a static form as illustrated in FIG. 2. This is to improve the access speed as well known in the art. However, at least one of the signals can have a static form.

Before the activation of the section word line, a bit line precharge operation is performed as follows. When the block select signal BSn and row and column pre-decoder signals XPDOn and YPDOn are low, the section word line select signals BSLi and column select signals Yi and YiB from the decoding block 150 become low. At this time, the OR gate G4 receiving the signals BSLi outputs the precharge signal PTOP of a logic low level. This forces the first precharge circuit 120 to precharge the bit lines BL and BLB. Furthermore, the second precharge circuit 130 precharges the bit lines BL and BLB in response to the column select signal Yi of a logic low level. At this time, a section word line SWL has a logic low level, and the Y-selector 150 is disabled in accordance with the column select signals Yi and YiB being low and high, respectively.

Figure 5:
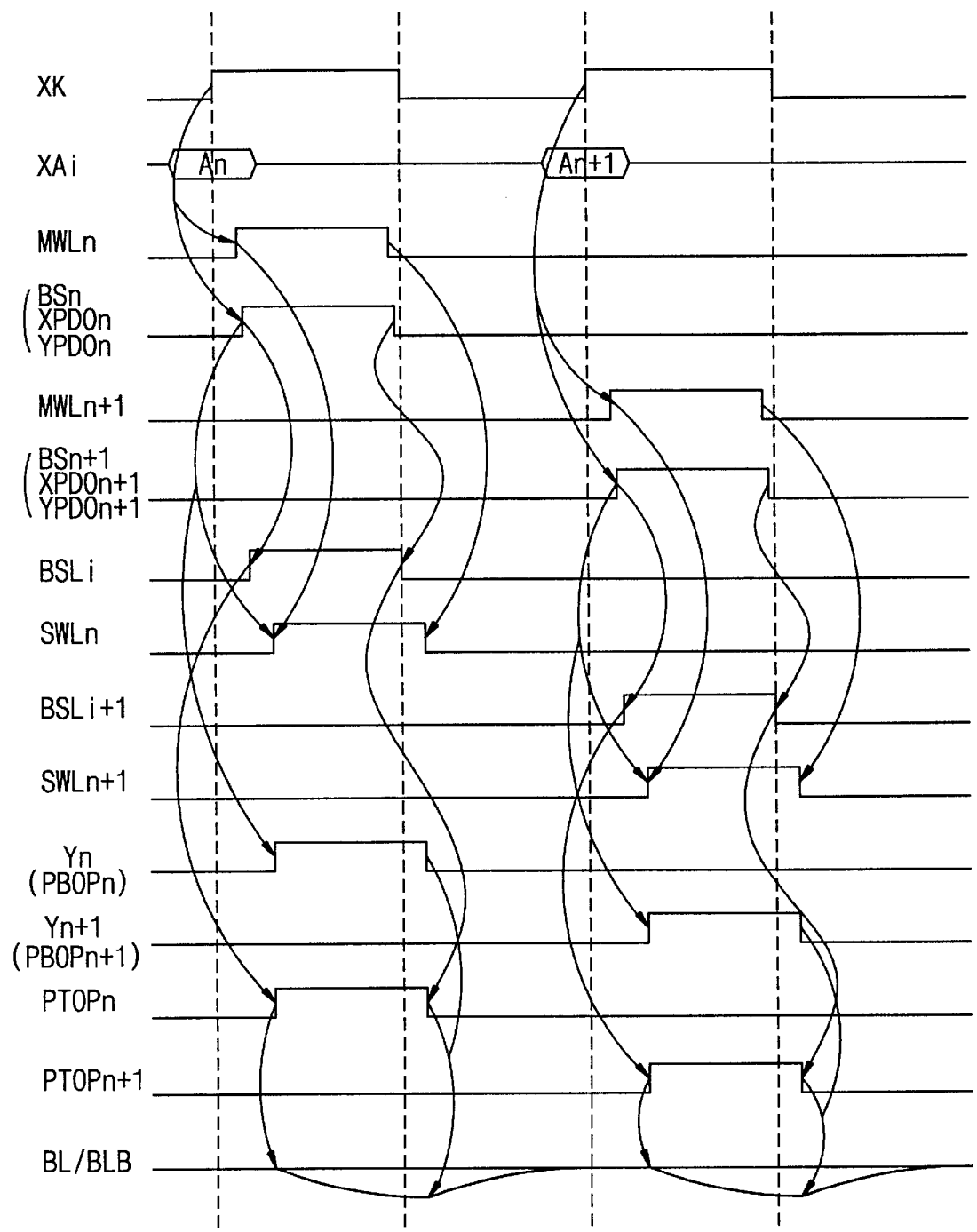
FIG. 5 is a timing diagram for describing a bit line precharge operation according to the present invention.

As shown in FIG. 5, the main word line select signal MWLn transitions from low to high, and, at the same time, one block select signal BSn, one row pre-decoder signal XPDOn, and one column pre-decoder signals YPDOn transition from low to high. The OR gate G4 used as the precharge signal generator makes the precharge signal PTOPn low in response to the section word line select signals BSLi, so that the first precharge circuit 120 is inactivated (disabled) (meaning that the bit lines BL and BLB are separated from the power supply). Similarly, the second precharge circuit 130 is inactivated by means of the column select signal Yn of a logic high level (used as a bottom side precharge signal). As a result, the bit lines BL and BLB become a high-impedance state. At the same time, the AND gate G5 drives the section word line SWLn with a word line voltage in response to the main word line select signal MWLn of a logic high level and the block select signal BSn of a logic high level. After this, reading/writing may be performed according to the manner well known in the art.

After reading/writing, as illustrated in FIG. 5, the signals MWLn, BSn, XPDOn and YPDOn transition from high to low, and the decoding block 150 makes both the block select signal BSn and the column select signal Yi low and makes the column select signal YiB high. As a result, the OR gate G4 receiving the signals BSLi each low outputs the precharge signal PTOPn of a logic low level. As set forth above, the first and second precharge circuits 120 and 130 precharge the bit lines BL and BLB. At this time, a section word line SWLn has a logic low level, and the Y-selector 150 is disabled in accordance with the column select signals Yi and YiB being low, respectively.

In a word, the OR gate G4 mixes the section word line select signals BSLi from the decoding block 150 to generate the precharge signal PTOPn. When all of the section word line select signals BSLi are low, the precharge signal PTOPn becomes low. Contrary, when one of the section word line select signals BSLi transitions from low to high, the precharge signal PTOPn is made high in synchronization with the signal BSLn of a logic high level. And, the second precharge circuit 130 operates in synchronization with the column select signal.

In accordance with the bit line precharge scheme of the present invention, the precharge circuit 120 at the top side of the bit lines operates in synchronization with the section word line select signal BSLi. Similarly, the precharge circuit 130 at the bottom side of the bit lines operates in synchronization with the column select signal Yi. The precharge signal PTOP auto-tracks the activation (inactivation) of the section word line, so that the period of the inactivation (activation) of the precharge signal PTOP exactly corresponds to that of the activation (inactivation) of the section word line SWLn (no overlapped period exists), as illustrated in FIG. 5. During the activation of the section word line SWLn, the bit lines BL and BLB have a high impedance state, respectively. Therefore, there is improved the read/write access speed of the SRAM device 100.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor memory device comprising:
    an array divided into a plurality of blocks each of which has a plurality of memory cells, each cell storing data and arranged at intersections of a plurality of section word lines and a plurality of bit line pairs;
    a decoding block for generating section word line select signals in response to a block select signal designating one block to be selected and row pre-decoder signals;
    a precharge circuit coupled with a top side of the bit line pairs, for precharging the bit line pairs in response to a precharge signal; and
    a precharge signal generator for generating the precharge signal from the section word line select signals.

2. The semiconductor memory device according to claim 1, wherein the precharge signal generator comprises an OR gate having input terminals receiving the section word line signals and an output terminal outputting the precharge signal.

3. The semiconductor memory device according to claim 1, wherein the decoding block further generates column select signals from the block select signal and column pre-decoder signals, and
    wherein the device further comprises:
    a column selector for selecting one bit line pair in response to the column select signals; and
    a second precharge circuit coupled at a bottom side of the bit line pairs, for precharging the bit line pairs in synchronization with the column select signals.

4. The semiconductor memory device according to claim 1, wherein the decoding block comprises:
    a row decoder for generating the section word line select signals in response to the block select signal and the row pre-decoder signals; and a column decoder for generating column select signals in response to the block select signal and column pre-decoder signals.

5. A semiconductor memory device comprising:

an array divided into plural blocks each of which has a plurality of memory cells each storing data and arranged in intersections of plural section word lines and plural bit line pairs;

a decoding block for generating section word line select signals and column select signals in response to a block select signal designating one block to be selected, row pre-decoder signals and column pre-decoder signals;

a column selector for selecting one bit line pair in response to the column select signals; and a bit line precharge section having a first precharge circuit coupled to a top side of the bit line pairs and a second precharge circuit coupled at a bottom side of the bit line pairs, wherein the first precharge circuit precharges the bit line pairs in response to a precharge signal, and wherein the second precharge circuit precharges the bit line pairs in synchronization with the column select signals; and a precharge signal generator for generating the precharge signal in synchronization with the section word line select signals, wherein when all of the section word line select signals are inactivated, the precharge signal generator activates the precharge signal in synchronization with the section word line select signals, and wherein the precharge signal generator inactivates the precharge signal in synchronization with the activation of at least one section word line select signal, so that the bit line pairs have a high impedance state.

6. The semiconductor memory device according to claim 1, wherein when all of the section word line select signals are inactivated, the precharge signal generator activates the precharge signal in synchronization with the section word line select signals, and wherein the precharge signal generator inactivates the precharge signal in synchronization with the activation of at least one section word line select signal.

* * * * *